(12) United States Patent
Totokawa et al.

(10) Patent No.: US 7,276,185 B2
(45) Date of Patent: Oct. 2, 2007

(54) CONDUCTOR COMPOSITION, A MOUNTING SUBSTRATE AND A MOUNTING STRUCTURE UTILIZING THE COMPOSITION

(75) Inventors: Masashi Totokawa, Nagoya (JP); Yuji Ootani, Nukata-gun (JP); Hirokazu Imai, Okazaki (JP); Akira Shintai, Chita (JP)

(73) Assignee: DENSO CORPORATION, Kariya (JP)

( * ) Notice: Subject to any disclaimer, the term of this patent is extended or adjusted under 35 U.S.C. 154(b) by 118 days.

(21) Appl. No.: 10/969,320

(22) Filed: Oct. 21, 2004

(65) Prior Publication Data

US 2005/0127536 A1 Jun. 16, 2005

(30) Foreign Application Priority Data

Oct. 22, 2003 (JP) .............................. 2003-362291

(51) Int. Cl.
- *H01B 1/22* (2006.01)
- *B32B 15/01* (2006.01)
- *B32B 27/14* (2006.01)

(52) U.S. Cl. ...................... 252/515; 252/500; 252/512; 428/357; 428/402; 428/403; 106/1.19

(58) Field of Classification Search ................ 252/500, 252/514; 427/96, 123, 125, 126; 174/256, 174/257, 259; 29/846; 257/923, 734, 789; 438/106, 115; 75/336; 106/1.18, 1.23, 31.14, 106/1.26

See application file for complete search history.

(56) References Cited

U.S. PATENT DOCUMENTS

| | | | | |
|---|---|---|---|---|
| 4,827,083 A | * | 5/1989 | Inasaka et al. ............. | 174/264 |
| 5,156,771 A | * | 10/1992 | Yamamoto et al. .......... | 252/512 |
| 5,759,230 A | * | 6/1998 | Chow et al. ................. | 75/362 |
| 5,882,722 A | * | 3/1999 | Kydd .......................... | 427/98.4 |
| 6,228,904 B1 | * | 5/2001 | Yadav et al. ................ | 523/210 |
| 6,866,800 B2 | * | 3/2005 | Adachi ........................ | 427/98.4 |

FOREIGN PATENT DOCUMENTS

| | | | |
|---|---|---|---|
| JP | 2000-319622 | * | 11/2000 |
| JP | A-2000-319622 | | 11/2000 |
| JP | 2001-110234 | * | 4/2001 |
| JP | 2001-119130 | * | 4/2001 |
| JP | A-2001-110234 | | 4/2001 |
| JP | A-2001-119130 | | 4/2001 |
| JP | 2002-299833 | * | 10/2002 |
| JP | A-2002-299833 | | 10/2002 |
| JP | A-2003-308730 | | 10/2003 |

* cited by examiner

*Primary Examiner*—Douglas McGinty
*Assistant Examiner*—Kallambella Vijayakumar
(74) *Attorney, Agent, or Firm*—Posz Law Group, PLC

(57) ABSTRACT

A conductor composition being able to easily secure the conductivity at the same level as an Ag bulk at low temperature process, a mounting substrate utilizing the conductor composition and a mounting structure utilizing the conductor composition are provided. In a mounting structure, wherein one or more electrodes (11) of a mounting substrate (10) and one or more surface mounting components (20) are connected through a conductor composition (30), and one or more surface wirings (14) of the mounting substrate (10), one or more inner-layer wirings (13) and one or more via conductors (12) are formed with the conductor composition, the conductor composition contains conductive particles with electrical conductivity, and the conductive particles are composed of low crystallized Ag fillers with the crystal size of 10 nm or less.

6 Claims, 4 Drawing Sheets

ABBRCONDUCTOR COMPOSITION, A
MOUNTING SUBSTRATE AND A
MOUNTING STRUCTURE UTILIZING THE
COMPOSITION

TECHNICAL FIELD

The present invention relates to a conductor composition containing conductive particles with electrical conductivity, a mounting substrate wherein wiring parts are formed by utilizing such a conductor composition, and a mounting structure wherein a component is mounted by utilizing such a conductor composition.

BACKGROUND

In general, this kind of a conductor composition comprises conductive particles with electrical conductivity and a solvent. Specifically speaking, for example, an electroconductive adhesive is known, wherein Ag fillers with particle diameters at the level of a micron or a sub-micron (in the order of 1 µm to 10 µm) was dispersed in a solvent and a binder resin such as an epoxy resin, etc. (refer to e.g. Japanese unexamined patent publication No. 2000-319622).

Further, as this kind of the conductor composition, a paste composition has been suggested, wherein fine metal particles with a mean particle diameter from 1 nm to 100 nm were covered on the surface with an organic compound which was able to coordinate with a metal atom contained in fine metal particles, and were stably dispersed in a liquid (refer to e.g. Japanese unexamined patent publication No. 2002-299833).

Such an electroconductive adhesive was used in order to form an electrical connect between a surface mounting component and the mounting substrate, by being placed between them, and to construct the mounting structure, when the surface mounting component was mounted on an electrode formed on one side of the mounting substrate.

This kind of conductor composition has been used also to form surface wiring, inner-layer wiring and a via conductor on a mounting substrate such as a print substrate, a ceramic substrate etc.

In the above-mentioned general conductor composition such as e.g. the electroconductive adhesive containing the Ag fillers, a connection was completed by being placed on the substrate, with steps of heating after being applied on a substrate such as an electrode, etc., evaporating a solvent and curing a binder resin.

Herein, a curing treatment for the electroconductive adhesive was, in general, carried out under a low temperature (e.g. about 150° C.) necessary to remove the solvent, or cure the binder resin.

In a case where such a process under the low temperature was achieved, an electrically conducting structure at the treated electroconductive adhesive was due to connections between Ag filler particles (conductive particles). Due to the connections, an electric resistance at the electroconductive adhesive dominantly depended on the contact resistance between these Ag filler particles.

Therefore, the conductivity of the electroconductive adhesive was approximately two orders of magnitude lower than the inherent conductivity of Ag, i.e. the conductivity at the same level as in an Ag bulk. Further, for the electrically conducting structure between the electroconductive adhesive and the substrate, there has been a problem of low reliability of the connection, due to electrical conduction by contact between the substrate and the Ag fillers.

For these problems, when the electroconductive adhesive (the conductor composition) is processed, it is deemed to be better to treat the adhesive at a temperature high enough to melt the conductive particles of the Ag fillers. It seems that, by the process, the electrically conducting structure at an inner part of the electroconductive adhesive and between the electroconductive adhesive and the substrate becomes a structure for an electrical conduct between the Ag fillers mutually melted together, and conductivity at the same level as Ag bulk can be obtained in the electroconductive adhesive.

However, in order to achieve such a melting situation, it is necessary to increase the temperature for treating the electroconductive adhesive to, for example, close to the melting point of Ag (about 800° C.). Considering the heat resistances of an electronic component, which forms the substrate material, and the substrate, such a process is not practical.

Against that, as described in Japanese unexamined patent publication No. 2002-299833, a conductor composition composed of only fillers (conductive particles) with a particle size of the order of nanometer has been suggested. The composition substantially had a structure wherein only the fillers with a smaller size, of the order of nanometer, than conventional particles, with a particle size of the order of micron, were dispersed in a solvent and a binder resin.

Accordingly, it is expected to have fillers melted together by making the fillers small in the order of nanometer, and decreasing the melting temperature of the fillers themselves, even if they were treated at a low temperature (e.g. about 150° C.) like the low temperature for processing the conductor composition mentioned above.

However, in a case of the conductor composition composed of only nanometer order fillers, their handling is difficult due to the small size of the filler particles, and their cost is higher in comparison with the conventional micron order filler particles.

As the filler particle size of the order of nanometer is much smaller than the conventional filler particles, the small filler's dispersing property, into the solvent and the binder resin, is poor. As a result, it has been difficult to obtain a practical conductivity, owing to the filler particles being unevenly distributed in the conductor composition, and the filler particles do not evenly melt together.

Therefore, considering the above-mentioned problems, the present invention was achieved to provide a conductor composition which can easily secure conductivity at the same level as Ag bulk with a low temperature treatment, a mounting substrate utilizing such a conductor composition, and a mounting structure utilizing such a conductor composition.

SUMMARY OF INVENTIONS

In order to achieve the purpose mentioned above, in a first embodiment of a conductor composition comprises conductive particles (30a) with electrical conductivity and a solvent, the conductive particles (30a) are composed of low crystallized Ag fillers (31) of which the crystal size is 10 nm or less.

Herein, the crystal size of each of the low crystallized Ag fillers (31) is the size of the crystal particle of one filler particle, and it is based on a result of measurement by X-ray diffraction that the crystal size is 10 nm or less.

In the past, in general, the crystal size of Ag filler utilized in this kind of the conductor composition was several tens of nanometers or more, and Ag filters (31) in the present invention comprise particles having a smaller size, in other words, being less crystallized than a conventional particles.

Based on studies by the inventors of the present invention, while a detailed mechanism has not been found, by utilizing the conductive particles (30a) composed of the low crystallized Ag fillers (31) with a particle size of 10 nm or less, high conductivity can be obtained by fusing or sintering Ag, with a treatment at a low temperature, at the same level as the conventional conductor composition composed of only fillers with a particle size of the order of nanometer mentioned above, even if the particle size of the conductive particles (30a) is in the order of micron.

In other words, according to the invention, a conductor composition can be provided which can easily ensure the conductivity at the same level as an Ag bulk by a low temperature process.

In the invention described in a second embodiment, for the conductor composition according to the first embodiment, conductive particles (30a) comprise low crystallized Ag fillers (31) and fine Ag particles (33) with a particle size of the order of nanometer adhering on surfaces of core particles which are crystallized Ag fillers (31).

As mentioned above, it can be achieved, as an effect, that the Ag particles (33) can be melted at a low temperature due to being made in the order of nanometer, by locating the fine Ag particles (33) having the size of the order of nanometer around the low crystallized Ag fillers (31) described in the first embodiment, and it is further possible to realize high conductivity by the low temperature process. In other words, in the present invention, it is preferable to process at a lower temperature.

In a third embodiment, as the conductor composition according the first or second embodiment, each of the low crystallized Ag fillers (31) has the size of the particle diameter of 0.1 μm or more and 20 μm or less.

In a fourth embodiment, at the conductor composition according to any of the first three embodiments, each of the low crystallized Ag fillers (31) is in the form of a sphere or a flake.

In a fifth embodiment, at the conductor composition according to any of the first four embodiments, each of the fine Ag particles (33) has a particle diameter in the range of 1 nm or more and 50 nm or less.

In a sixth embodiment, as the conductor composition according to any of the first five embodiments, the amount of the adhered fine Ag particles (33) is 50 wt % or less of the low crystallized Ag fillers (31).

As described in the third to sixth embodiments, the size and the shape of the low crystallized Ag fillers (31), and the size and the amount of the fine Ag particles (33) can be concretely realized.

In a seventh embodiment, the conductor composition according to any of the first six embodiments features that the conductor composition contains a binder resin (32) with the conductive particles (30a) and the solvent, and is applied as an electroconductive adhesive.

In an eighth embodiment, at a mounting structure utilizing a conductor composition comprising a mounting substrate (10) having one or more electrodes (11) on one side of the substrate (10), and one or more surface mounting components (20) mounted on the electrode(s) (11) of the mounting substrate (10), wherein the electrode(s) (11) and one or more surface mounting components (20) are bonded through a conductor composition (30), the conductor composition comprises conductive particles (30a), and the conductive particles (30a) are composed of a low crystallized Ag fillers (31) of which the crystal size is 10 nm or less.

As in the first embodiment described above, by utilizing the conductive particles (30a) composed of the low crystallized Ag fillers (31) with a size of 10 nm or less, high conductivity can be obtained by fusing or sintering Ag, with a treatment under a low temperature in the same level as the conventional conductor composition composed of only filler particles with the size in the order of nanometer mentioned above, even if the particle size of the conductive particles (30a) is in the order of micron.

In other words, according to the present embodiment, a conductor composition can be provided, which can easily ensure the resistance at the same level as Ag bulk by a low temperature process.

In a ninth embodiment, for the mounting structure utilizing the conductor composition according to the eighth embodiment, the conductive particles (30a) comprise the low crystallized Ag fillers (31) and the fine Ag particles (33) with a particle size of the order of nanometer adhering on surfaces of core particles which are the crystallized Ag fillers (31).

According to the present embodiment, based on the same reason as described in the second embodiment, the mounting structure is provided, which utilizes the preferable conductor composition that can be treated at lower temperature.

In a 10th embodiment, in the mounting structure utilizing the conductor composition according to the eighth or ninth embodiments, each of the low crystallized Ag fillers (31) has the size of the particle diameter of 0.1 μm or more and 20 μm or less.

In an 11th embodiment, in the mounting structure utilizing the conductor composition according to any of the eighth to 10th embodiments, each of the low crystallized Ag fillers (31) is in the form of a sphere or a flake.

In a 12th embodiment, for the mounting structure utilizing the conductor composition according to any of the eighth through 11th embodiments, each of the fine Ag particles (33) has the particle diameter in the range of 1 nm or more and 50 nm or less.

In a 13th embodiment, for the mounting structure utilizing the conductor composition according to any of the eight through 12th embodiments, the amount of the adhered fine Ag particles (33) is 50 wt % or less of the low crystallized Ag fillers (31).

In a 14th and embodiment, for the mounting structure utilizing the conductor composition according to any of the eighth through 13th embodiments, the conductor composition comprises a binder resin (32) with the conductive particles (30a) and the solvent, and is applied as an electroconductive adhesive.

Further, in a 15th embodiment, for a mounting substrate utilizing a conductor composition wherein one or more surface wirings (14) and one or more inner-layer wirings (13) and one or more via conductors (12) are formed, the conductor composition contains conductive particles (30a) with electrical conductivity, and the conductive particles (30a) are composed of low crystallized Ag fillers (31) of which the crystal size is 10 nm or less.

According to the present embodiment, just as the first embodiment described above, by utilizing the conductive particles (30a) composed of the low crystallized Ag fillers (31) with a particle size of 10 nm or less, high conductivity can be obtained by fusing or sintering Ag, with a treatment under a low temperature at the same level as the conventional conductor composition composed of only filler particles with the size in the order of nanometer mentioned above, even if the particle size of the conductive particles (30a) is in the order of micron.

In other words, according to the present embodiment, a conductor composition can be provided which can easily ensure the resistance at the same level as an Ag bulk by the low temperature process.

In a 16th embodiment, for the mounting substrate utilizing the conductor composition according to the 15th embodiment, the conductive particles (30*a*) comprise the low crystallized Ag fillers (31) and fine Ag particles (33) with a particle size of the order of nanometer adhering on surface of core particles which are the crystallized Ag fillers (31).

According to the embodiment, based on the same reasons as described in the second embodiment, a mounting substrate is provided which utilizes the preferable conductor composition that can be treated at lower temperature.

In a 17th embodiment, for the mounting substrate utilizing the conductor composition according to the 15th or 16th embodiments, each of the low crystallized Ag fillers (31) has the size of the particle diameter of 0.1 μm or more and 20 μm or less.

In an 18th embodiment, for the mounting substrate utilizing the conductor composition according to any of the 15th to 17th embodiments, each of the low crystallized Ag fillers (31) is in the form of a sphere or a flake.

In a 19th embodiment, for the mounting substrate utilizing the conductor composition according to any of the 15th to 18th in embodiments, each of the fine Ag particles (33) has the particle diameter in the range of 1 nm or more and 50 nm or less.

In a 20th embodiment, for the mounting substrate utilizing the conductor composition according to any of the 15th to 19th embodiments, the amount of the adhered fine Ag particles (33) is 50 wt % or less of the low crystallized Ag fillers (31).

In a 21st embodiment, for the mounting substrate utilizing the conductor composition according to any of the 15th to 20th embodiments, the conductor composition comprises a binder resin (32) in conjunction with the conductive particles (30*a*) and the solvent, and is applied as an electroconductive adhesive.

A number in parenthesis for each of the means described above indicates one example showing a correspondence with a concrete means in embodiments described below.

DETAILED DESCRIPTION

Further, embodiments of the present invention are explained, by using drawings, as follows. Among the embodiments described below, the same number for the same part, or a part in an equivalent range, is utilized.

FIRST EMBODIMENT

Figure 1:
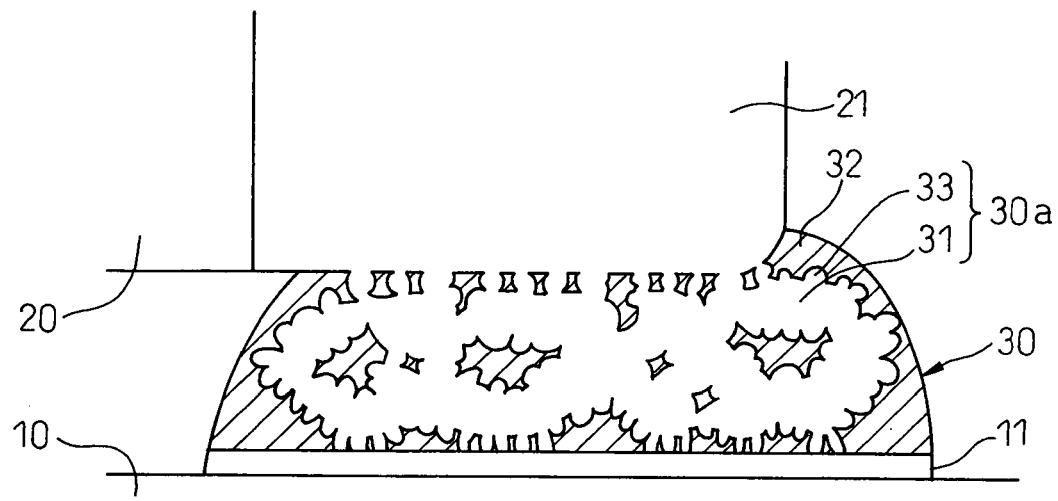
FIG. 1 shows a sectional drawing to roughly illustrate a main part of a mounting structure utilizing a conductor composition according to the first embodiment of the present invention.

FIG. 1 is a sectional drawing to roughly illustrate a main part of the mounting structure utilizing the conductor composition of the first embodiment according to the present invention.

The surface mounting component (20) is mounted on the mounting substrate (10), and the electrode (11) of the mounting substrate (10) and the electrode (21) of the surface mounting component (20) are electrically connected through the electroconductive adhesive (30) which is the conductor composition. Hereinafter, the electrode (11) of the mounting substrate (10) is referred to as a substrate electrode (11), and the electrode (21) of the surface mounting component (20) is referred to as a component electrode (21).

A printed substrate, a ceramic substrate, a lead-frame or etc. can be employed as the mounting substrate (10), but there is no particular limitation. The substrate electrode (11) is formed on one side of the mounting substrate (10), and is constructed from a thick-film or metal plating utilizing a material of e.g. Ag-based metals such as Ag (silver), AgSn (an alloy of silver and tin), AgPd (an alloy of silver and palladium) etc., Cu-based metals such as Cu (copper), CuNi (an alloy of copper and nickel) etc., Ni-based metals or Au (gold) etc.

As the surface mounting component (20), an electronic component such as a capacitor, a resistance element, a semiconductor element etc. can be employed. In the example shown in the drawing, the surface mounting component (20) is shown as an example utilizing a chip capacitor. The component electrode (21) is also made from a metal. As the metal for the component electrode (21), Au-based metals, Ag-based metals, Ni-based metals, Sn-based metals and etc. are utilized. As one example herein, the Sn-based metal is utilized.

Figure 2:
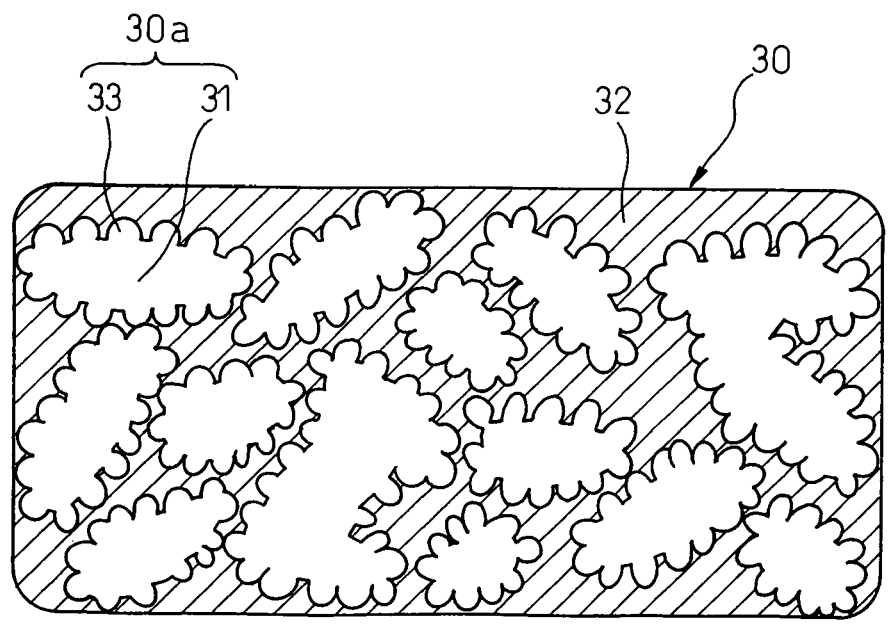
FIG. 2 shows a schematic drawing to illustrate an electroconductive adhesive (conductor composition) before curing.

FIG. 2 is a schematic drawing to illustrate the electroconductive adhesive (the conductor composition) in a situation before curing. The electroconductive adhesive (30) is the conductor composition comprising the conductive particles (30*a*) in conjunction with electrical conductivity, the solvent and also the binder resin (32). In FIG. 2, it is omitted to draw the solvent.

The conductive particles (30*a*) are composed of the low crystallized Ag fillers (31) with the crystal size of 10 nm or less.

In examples shown in FIG. 1 and FIG. 2, as preferable embodiments according to the present invention, the conductive particles (30*a*) comprise the low crystallized Ag fillers (31) and fine Ag particles (33) with a particle size of the order of nanometer adhering on surfaces of core particles which are the low crystallized Ag fillers (31).

In FIG. 1, a situation is shown where the substrate electrode (11) and the component electrode (21) are connected through the electroconductive adhesive (30), by using an electroconductive adhesive (30). This is a situation where, at the electroconductive adhesive (30) shown in FIG. 2, the solvent has evaporated, and the binder resin (32) is cured.

In a situation where the substrate electrode (11) and the component electrode (21), as shown in FIG. 1, are connected through the electroconductive adhesive (30), the fine Ag particles (33) are mutually connected electrically under the condition of being fused or sintered by melting or sintering together. The substrate electrode (11), the component electrode (21) and the fine Ag particles (33) are also electrically connected under the condition of being fused or sintered by the fine Ag particles (33) melting or sintering together.

Herein, it is due to a result of X-ray diffraction measurement that the crystal size of each of the low crystallized Ag fillers (31) is 10 nm or less. The crystal size of the conventional Ag fillers utilized for this kind of conductor composition has been generally several tens of nanometers or more. The low crystallized Ag fillers (31) in this embodiment have the smaller crystal size than the conventional Ag fillers, in other words, are crystallized lower than the conventional Ag fillers.

Specifically speaking, for example, the low crystallized Ag fillers (31) can be in the form of a sphere or a flake, and can have a particle size with a particle diameter of 0.1 μm or more and 20 μm or less.

In this example, for the fine Ag particles (33) adhered on the low crystallized Ag fillers (31), for instance, the particles with a particle size in the range of 1 nm or more and 50 nm or less can be employed. The amount of the adhered fine Ag particles (33) can be in the range of more than 0 wt % and about 50 wt % or less.

For the solvent, a solvent applied to a conventional electroconductive adhesive can be utilized. For example, a solvent such as terpineol, etc. can be employed as the solvent.

In this electroconductive adhesive (30), the resin (32) is a mixture comprising a main component, a curing agent, a reducing agent, a dispersing agent for nano particles and a trapping agent for nano particles.

The reducing agent is added according to necessity, and may be not added. The dispersing agent for nano particles and the trapping agent for nano particles are necessary, in a case where the fine Ag particles (33) in this example are utilized. When these fine Ag particles (33) are not utilized, the dispersing agents may not be added.

As the main component, a material selected from epoxy-based resins and mixed materials containing the epoxy-based resins can be employed, and the material selected from phenol compounds and mixed materials thereof can be employed.

The reducing agent is a compound which reduces a metal oxide layer formed on a surface of the component electrode (21) at a temperature equal to or less than the curing temperature (generally from about 100° C. to about 200° C.) of the electroconductive adhesive (30). An agent selected from e.g. alcohol-based compounds, organic acid-based compounds, imidazole-based compounds etc. can be employed.

More concretely, as the reducing agent, trimethylolpropane, trimethylolethane, glycerol, tetraethylene glycol, diethylene glycol, ribitol etc. can be employed.

As mentioned above, in this example, as the preferable electroconductive adhesive (30), particles are utilized which are formed by adhering fine Ag particles (33) having a particle size of nanometer the order of nanometer on surfaces of the low crystallized Ag fillers (31) which are the core particles, by utilizing the low crystallized Ag fillers (31) with a crystal size of 10 nm or less as the core particle.

Such an electroconductive adhesive (30) can be prepared as follows. By heating a mixture of the low crystallized Ag fillers (31) and the fine Ag particles (33) in a solution or in a gas, a fusion or adhesion etc. due to sintering the fine Ag particles (33) onto the surface of the low crystallized Ag fillers (31) is carried out. The low crystallized Ag fillers (31), of which the fine Ag particles (33) are located on the surface, is formed by this process.

The temperature for this heating in a solution or in a gas is lower than at least the curing temperature of the electroconductive adhesive (30), and an amount of sintered fine Ag particles (33) is kept low, so that a reaction of the fusion or sintering of the fine Ag particles (33) can proceed in a curing process of the electroconductive adhesive (30) to be carried out later.

Then, the low crystallized Ag fillers (31), of which the fine Ag particles (33) are located on the surface, are mixed with the main component and the curing agent and, if necessary, the reducing agent, further the dispersing agent for nano particles and the trapping agent for nano particles, which construct the binder resin (32), as well as the solvent together. Thus, the electroconductive adhesive (30) of this example is completed.

Figure 3:
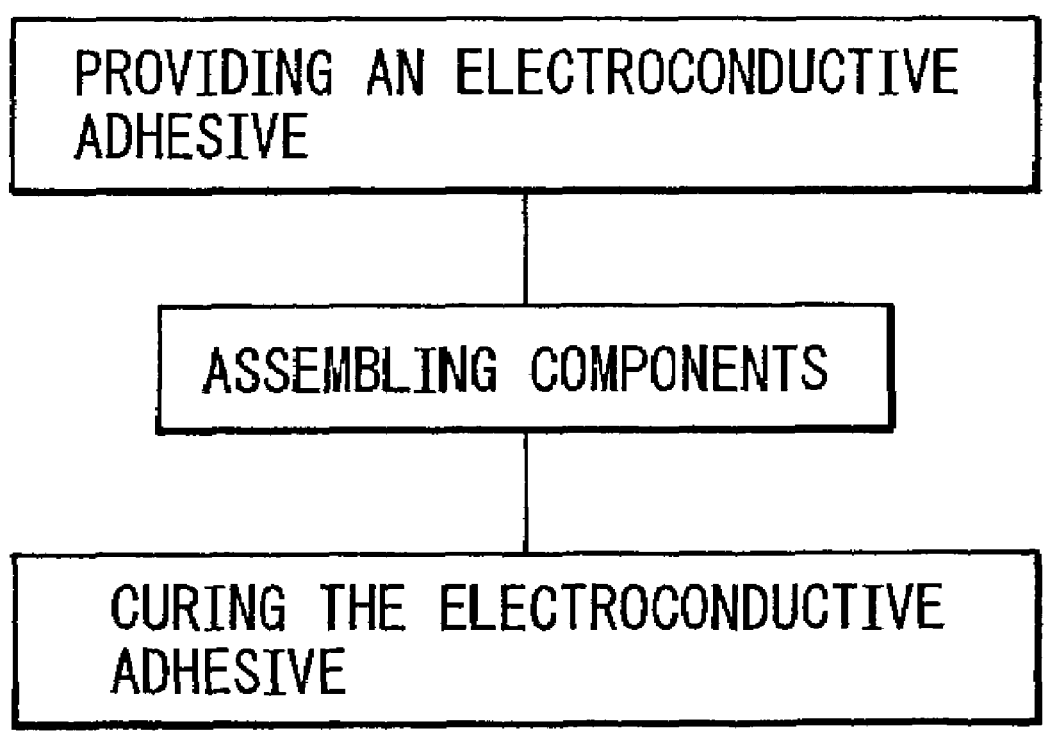
FIG. 3 shows a process chart to show a method for assembling a mounting structure shown in FIG. 1.

A method for connecting the surface mounting component (20) with the mounting substrate (10) by utilizing the electroconductive adhesive (30) of this example formed in the manner mentioned above is described as follows. FIG. 3 is a process chart to illustrate the method for assembling the mounting structure shown in FIG. 1.

At first, in a step for providing the electroconductive adhesive, the above-described electroconductive adhesive (30) is provided on the substrate electrode (11) of the mounting substrate (10) by mask-printing or dispensing. After that, in a step for assembling the components, the surface mounting component (20) is mounted on the mounting substrate (10) under the condition of being registered between the substrate electrode (11) and the component electrode (21).

The steps until this process are carried out in atmosphere at the room temperature, and the electroconductive adhesive (30) is still un-cured. At this example, in the electroconductive adhesive (30) at this situation, sintering of the fine Ag particles (33) is prevented due to the situation where, as shown in FIG. 2, the dispersing agent for the nano particles coats the fine Ag particles (33), which are in the order of nanometer, in other words the nano-particles. For the purpose, the low crystallized Ag fillers (31) in the binder resin (32) are evenly dispersed in the resin (32).

After that, in a step for curing an electroconductive adhesive, the electroconductive adhesive (30) is heated at the curing temperature from about 100° C. to about 200° C., and cured. By the step, the connection between the surface mounting component (20) and the mounting substrate (10) is finished, and the mounting structure shown FIG. 1 is completely formed.

In this curing step, a function as described below proceeds. Owing to the heat during the curing step, an oxide layer formed on a surface of the component electrode (21) at the early stage is removed by a reducing agent, when a reducing agent is contained in the binder resin (32).

At this curing step, in this example where the fine Ag particles (33) of nano particles are utilized, the trapping agent for nano particles traps the dispersing agent for nano particles wherein the fine Ag particles (33) are coated by the dispersing agent for nano particles and the trapping agent for nano particles.

By the heat during the curing step, the fine Ag particles (33) adhering to the low crystallized Ag fillers (31) melt or sinter, and further both surfaces of the component electrode (21) and the substrate electrode (11) and the fine Ag particles (33) fuse or sinter together, and at the same time the fine Ag particles (33) fuse or sinter to each other by mutually melting or sintering.

In other words, as described in FIG. 1, an electrically conducting formation by fusing or sintering of the fine Ag particles (33) is formed among three parts of the component electrode (21), the low crystallized Ag fillers (31) (conductive particles (30a)) and the substrate electrode (11).

In this embodiment, the conductive particles (30a) may be composed of only the low crystallized Ag fillers (31) with the crystal size of 10 nm or less, and free of the fine Ag particles (33) with a particle size of the order of nanometer.

In such a case, at the above-mentioned step for curing the electroconductive adhesive, the low crystallized Ag fillers (31) causes fusion or sintering at the curing temperature of the binder resin (32), e.g. from about 100° C. to about 200° C. Owing to that, interstices among particles of the low crystallized Ag fillers (31) and interstices between the low crystallized Ag fillers (31) and each electrodes (11) and (21) are electrically connected under the condition of being fused or sintered.

With respect to this matter, an experimental investigation was achieved. While a particular mechanism is not found, it seems to be based on a behavior that a low crystallized part has a tendency to stabilize by crystallizing via heat treatment during the curing process, by utilizing the electroconductive adhesive (30) composed of the low crystallized Ag fillers (31) with the crystal size of 10 nm or less.

Due to the behavior, Ag can obtain the high conductivity by fusing or sintering, in the treatment at low temperature (e.g. about 150° C.) at the same level as a conductor composition composed of only the above-mentioned conventional fillers with a particle size of the order of nanometer, even if the particle size of the conductive particles (30a), in other words the particle size of the low crystallized Ag fillers (31), is in the order of micron.

In other words, according to this embodiment, by utilizing the low crystallized Ag fillers (31) with the crystal size of 10 nm or less as the conductive particles (30a), for the electroconductive adhesive (30) as the conductor composition comprising the conductive particles (30a) with electrical conductivity and the solvent, the electroconductive adhesive (30) as the conductor composition, which can easily ensure the conductivity in the same level as the bulk Ag by the low temperature process, can be provided.

In preferable embodiment examples of the present invention illustrated in FIG. 1 and FIG. 2, the electroconductive adhesive (30) is provided as the conductor composition, wherein the conductive particles (30a) are composed of the low crystallized Ag fillers (31) as core particles and the fine Ag particles (33) with a particle size of the order of nanometer adhering on the core particle's surface.

As described above, due to achieving the size of the order of nanometer by locating the fine Ag particles (33) with a particle size of the order of nanometer around the low crystallized Ag fillers (31), an effect of the fine Ag particles (33) melting at low temperature can be achieved.

This seems to be based on a behavior that the fine Ag particles (33) with a particle size of the order of nanometer have a tendency to stabilize by decreasing their surface area. Due to the behavior, an achievement of high conductivity by the low temperature process is further promoted, and it becomes possible to fuse the electroconductive adhesive (30) by a lower temperature process. Therefore, this embodiment is preferable.

For example, in the conventional conductor composition, a contact resistance between Ag fillers contacting each other by a pressure was dominant, and its conductivity was $10^{-4}$ Ω.cm or more as volume resistivity of the conductor composition.

In contrast, for the electroconductive adhesive (conductor composition) (30) described in FIG. 1 according to the embodiment of the present invention, its volume resistivity is from about $5 \times 10^{-6}$ Ω.cm to about $5 \times 10^{-5}$ Ω.cm, and the conductivity is greatly improved.

In the embodiment of the present invention, a mounting structure is provided, which utilizes a conductor composition comprising a mounting substrate (10) having an electrode (11) on one side of the substrate (10), and a surface mounting component (20) mounted on the electrode (11) of the mounting substrate (10), wherein the electrode (11) and a surface mounting component (20) are bonded through a electroconductive adhesive (30), wherein conductive particles (30a) in the electroconductive adhesive (30) are composed of low crystallized Ag fillers (31) of which the crystal size is 10 nm or less.

Accordingly, a mounting structure utilizing the conductor composition, which can easily secure the resistance in the same level as Ag bulk by the low temperature process, can be provided.

In a preferable formation of this embodiment, the mounting structure utilizing a preferable conductor composition which can be handled at lower temperature is provided, by employing the mounting structure wherein the conductive particles (30a) are utilized as core particles, and the fine Ag particles (33) with a particle size of the order of nanometer are adhered on the core particles' surfaces.

In this embodiment, as one example, a Sn-based metal, wherein it has been difficult in the past to make the resistance at a connecting part low, is utilized as the component electrode (21) of the surface mounting component (20). If the electroconductive adhesive (30) in this embodiment is utilized, it can be easily achieved to make the resistance low at the connection for the component electrode (21) utilizing this Sn-based metal.

SECOND EMBODIMENT

Figure 4:
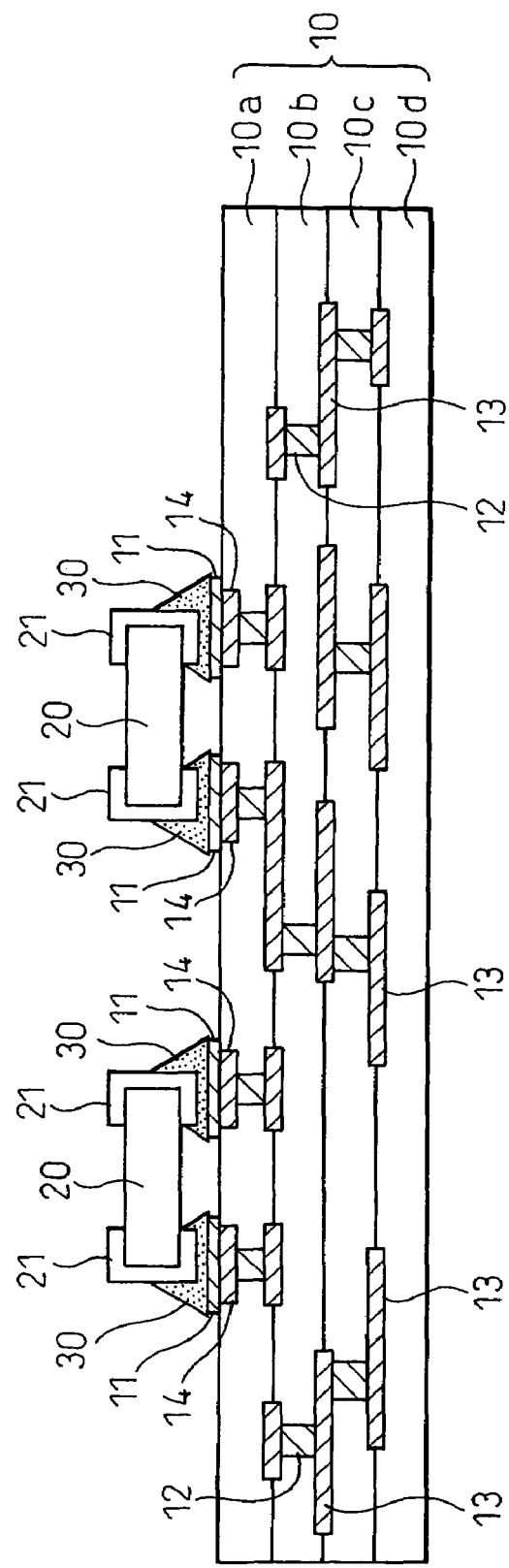
FIG. 4 shows a sectional drawing to roughly illustrate the mounting structure utilizing a conductor composition according to the second embodiment of the present invention.

FIG. 4 is a sectional drawing to roughly illustrate a mounting structure utilizing the conductor composition according to the second embodiment of the present invention. A different point from the above-mentioned embodiment is primarily described below.

The surface mounting components (20) are mounted on the mounting substrate (10), the substrate electrodes (11) of the mounting substrate (10) and the component electrodes (21) of the surface mounting components (20) are electrically connected each other through the electroconductive adhesive (30) as the conductor composition. Herein, the electroconductive adhesive (30) is the same as in the above-mentioned embodiment.

In this embodiment, the mounting substrate (10) is formed by laminating a plurality of resin layers 10a, 10b, 10c and 10d, made of the resin, and sintered.

In this mounting substrate (10), various kinds of wiring parts (12)-(14) are formed, and these wiring parts (12)-(14) are constructed from via conductors (12), inner-layer wirings (13) formed inside the mounting substrate (10) and surface wirings (14) located at one side (upper side in FIG. 4) of the mounting substrate (10).

The via conductors (12) are located at via holes formed in the various resin layers (10a)-(10d), and the inner-layer wirings (13) are formed between the various resin layers (10a)-(10d). These wiring parts (12)-(14) are electrically connected each other. The surface wirings (14) are electrically connected with the substrate electrodes (11).

Herein, in this embodiment, the via conductors (12), the inner-layer wirings (13) and the surface wirings (14) are constructed from the conductor composition comprising conductive particles (30*a*) with electrical conductivity. This conductor composition is composed of the low crystallized Ag fillers, wherein the conductive particles have a crystal size of 10 nm or less.

Specifically speaking, in the electroconductive adhesive (30) illustrated in FIG. 2, the conductor composition containing little binder resin (32), and containing the low crystallized Ag fillers (31) and the solvent is utilized. When high adhesive properties with the substrate etc. are necessary, for example, it may be an adhesive wherein an epoxy-based resin etc. of several wt % is added.

The via conductors (12), the inner-layer wirings (13) and the surface wirings (14), described above, are formed, by patterning via a printing method, and heat-treating etc., with this conductor composition. In these wiring parts (12)-(14), an electrically conductive situation is ensured, by vaporizing the solvent of the conductor composition, and fusing or sintering the low crystallized Ag fillers (31) each other.

In the conductor composition of this embodiment also, the composition is preferred, wherein the conductive particles (30*a*) are utilized as core particles, and the fine Ag particles (33) with a particle size of the order of nanometer are adhered on the core particles' surfaces (see FIG. 2).

When the above-described via conductors (12), inner-layer wirings (13) and surface wirings (14) are formed by using this conductor composition with a preferable formation, as illustrated in FIG. 1, the conductor composition is electrically connected under the condition of the solvent being evaporated, and the fine Ag particles (33) fused or sintered by melting or sintering the fine Ag particles together.

In this embodiment also, for example, each of the low crystallized Ag fillers (31) can be in the form of a sphere or a flake, and the low crystallized Ag fillers (31) can have the size of the particle diameter of 0.1 µm or more and 20 µm or less.

Further, in this embodiment also, for example, particles with the particle diameter in the range of 1 nm or more and 50 nm or less can be employed as the fine Ag particles (33) adhering on the low crystallized Ag fillers (31). Then, the adhering amount of the fine Ag particles (33) can be in the range of beyond 0 wt % and about 50 wt % or less of the low crystallized Ag fillers (31).

As the solvent, a solvent which can be applied for a usual electroconductive adhesive can be utilized. For example, a solvent such as terpineol, etc., can be employed as the solvent.

In the mounting structure shown in FIG. 4, the same one as described in embodiment above can be utilized as the surface mounting component (20), but it is not limited in particular. For example, as the surface mounting components (20), a molded capacitor, a molded diode, a ceramic capacitor etc. can be employed. In this example, a molded capacitor is shown as the surface mounting components (20).

Figure 5:
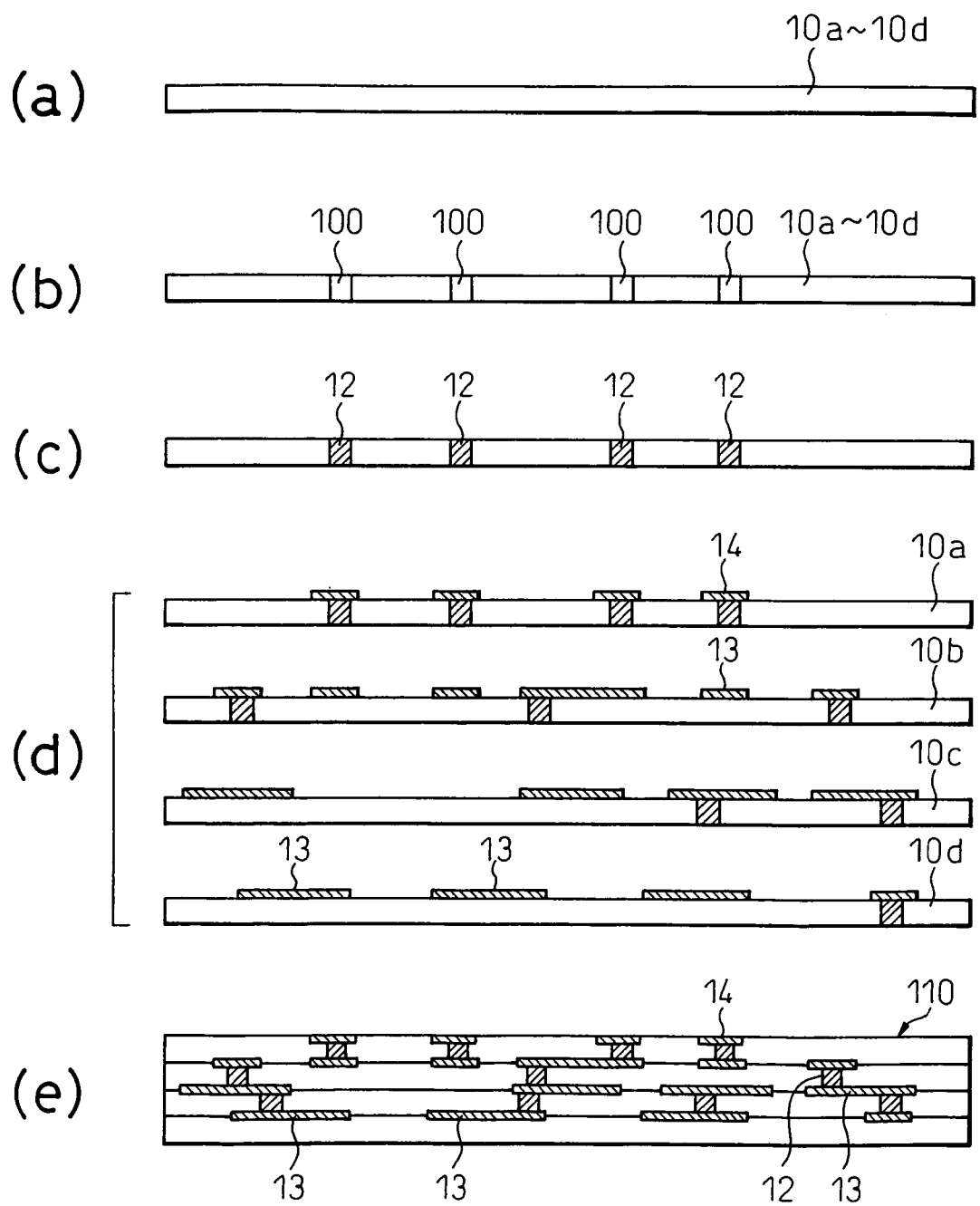
FIG. 5 shows a process chart to show a method for manufacturing a mounting substrate in a mounting structure shown in FIG. 4.

Next, a method for forming the mounting structure illustrated in FIG. 4 above is described. FIG. 5 including (*a*), (*b*), (*c*), (*d*) and (*e*) is a process chart showing a method for preparing the mounting substrate (10) in this forming method.

As a first step, as described in FIG. 5(*a*)-(*c*), holes (100) are formed at each of resin sheets (10*a*)-(10*d*) as plural resin layers, and the conductor composition of this embodiment comprising the conductive particles (30*a*) and the solvent is filled in the holes (100) by screen-printing etc., and the via conductors (12) are formed.

After that, the conductor composition is printed also on a surface of each of the resin sheets (10*a*)-(10*d*) in a desired pattern by the screen-printing method etc. Thus, as shown in FIG. 5(*d*), wiring parts (12)-(14) composed of the via conductors (12), the inner-layer wirings (13) and the surface wirings (14) are formed.

As shown in FIG. 5(*e*), a laminated structure (110) is formed by stacking a group of resin sheets prepared in this manner, pressing and combining them in one unit. Further, by sintering the laminated structure (110), main substrate parts of the mounting substrate (10) are completed, and each of the wiring parts (12)-(14) is sintered.

After sintering, the substrate electrodes (11) are formed by carrying out metal plating or thick-film printing at the surface wirings (14). Thus, the mounting substrate (10) is completed.

In this mounting substrate (10) utilizing the conductor composition forming the surface wirings (14), the inner-layer wirings (13) and the via conductors (12), the conductor composition contains conductive particles (30*a*) with electrical conductivity, and the conductive particles (30*a*) are composed of the low crystallized Ag fillers (31) with a crystal size of 10 nm or less.

After that, the electronic components are mounted on one side of the mounting substrate (10). This mounting process is the same as the method described in FIG. 3 above.

In other words, in the step for providing the electroconductive adhesive, the electroconductive adhesive (30) is provided on the substrate electrodes (11) of the mounting substrate (10) by mask-printing or dispensing. Then, in the step for assembling components, the surface mounting components (20) are mounted on the mounting substrate (10) under the condition of being registered between the substrate electrodes (11) and the component electrodes (21).

In a next step for curing the electroconductive adhesive, the electroconductive adhesive (30) is heated at the curing temperature of about 100° C.-240° C., and cured. By this process, a connection between the surface mounting components (20) and the mounting substrate (10) is completed, and the mounting structure described in FIG. 4 is formed.

By the way, in this embodiment, as in the above-described embodiment, the conductor composition comprising the conductive particles (30*a*) in conjunction with electrical conductivity and the solvent, wherein the conductive particles (30*a*) are composed of the low crystallized Ag fillers (31) with the crystal size of 10 nm or less, and the electroconductive adhesive (30) as such a conductor composition, are provided.

In this embodiment, as in like the above-described embodiment, the mounting substrate (10) utilizing the conductor composition is provided, wherein the mounting substrate comprises the mounting substrate (10) having the electrodes (11) on one side and the surface mounting components (20) mounted on the electrodes (11) of the mounting substrate (10), and utilizes the conductor composition connecting the substrate electrodes (11) and the surface mounting components (20) by filling the gap between them, and the conductor composition contains the conductive particles (30*a*) with electrical conductivity, and the conductive particles (30*a*) are composed of the low crystallized Ag fillers (31) with the crystal size of 10 nm or less.

Further, in this embodiment, the mounting substrate (10) utilizing the conductor composition is provided, wherein the surface wirings (14), the inner-layer wirings (13) and the via conductors (12) are formed with the conductor composition, the conductor composition contains the conductive particles (30*a*) with electrical conductivity, and the conductive particles (30a) are composed of the low crystallized Ag fillers (31) with the crystal size of 10 nm or less.

According to this embodiment, as in the above-described embodiment, by utilizing the conductive particles (30a) composed of the low crystallized Ag fillers (31) with the crystal size of 10 nm or less, Ag can provide the high conductivity by fusing or sintering, in the treatment at low temperature of the same level as a conductor composition composed of only the above-mentioned conventional fillers with a particle size of the order of nanometer, even if the particle size of the conductive particles (30a) is in the order of micron.

In other words, according to this embodiment, the conductor composition which can easily ensure the resistance at the same level as an Ag bulk by the low temperature process, the mounting structure utilizing the conductor composition, and the mounting substrate utilizing the conductor composition can be provided.

In this embodiment also, in a preferable formation or, in other words, in a case where the low crystallized Ag fillers (31) are utilized as core particles, and the fine Ag particles (33) with a particle size of the order of nanometer adhere on surfaces of the core particles to form the conductive particles (30a), the effect can be achieved that the Ag particles (33) can melt at low temperature due to being made in the order of nanometer.

Incidentally, while a laminated resin substrate was illustrated as an example of the mounting substrate (10) in this embodiment, a laminated ceramic substrate may be utilized. A construction and a manufacturing method of the substrate are in conformance with the construction and the manufacturing method for the above-mentioned laminated resin substrate.

OTHER EMBODIMENT

While the example, where chip-capacitors or mold-capacitors were utilized as the surface mounting components, was described in the above-mentioned embodiment, a component, etc., such as a capacitor, a resistor, a semiconductor element, an IC package etc. can be employed as the surface mounting component. For example, a molded diode component comprising a lead made of copper as an electrode may be utilized as the surface mounting component.

Further, in the above-mentioned embodiment, while the surface mounting components (20) are mounted on the mounting substrate (10), and the electrodes (11) of the mounting substrate (10) and the electrodes (12) of the surface mounting components (20) are connected via the electroconductive adhesive (30), a step for packaging may be carried out after carrying out such a mounting.

For example, while not being illustrated as a drawing, in the mounting structure described in FIG. 1, a radiating plate composed of Al may be further adhered on the substrate (a component mounting substrate), and this radiating plate and a case may be further adhered and, after that, the structure may be sealed by silicone gel.

However, a formation of the package is not limited to the above-described one, and the silicone gel may be used, or not used, and may be substituted with other moisture-resistant coating material.

For example, in FIG. 1 described above, a connecting part of the surface mounting component (20) with the mounting substrate (10) and its peripheral parts may be reinforced by an under-fill resin. A sealing structure using a mold resin also may be employed.

We claim:

1. A conductor composition comprising conductive particles (30a) with electrical conductivity and a solvent, wherein said conductive particles (30a) comprise crystallized Ag fillers (31) having a crystal size of 10 nm or less, and each of said crystallized Ag fillers (31) having a particle diameter of 0.1 µm or more and 20 µm or less.

2. A conductor composition according to claim 1, wherein said conductive particles (30a) comprise said crystallized Ag fillers (31) and fine Ag particles (33) with a particle size of the order of nanometer adhering on surfaces of core particles which are said crystallized Ag fillers (31).

3. A conductor composition according to claim 1, wherein each of said crystallized Ag fillers (31) is in the form of a sphere or a flake.

4. A conductor composition according to claim 2, wherein each of said fine Ag particles (33) has a particle diameter in the range of 1 nm or more and 50 nm or less.

5. A conductor composition according to claim 2, wherein the amount of said adhered fine Ag particles (33) is 50 wt % or less of said crystallized Ag fillers (31).

6. A conductor composition according to claim 1, wherein the conductor composition comprises a binder resin (32) in conjunction with said conductive particles (30a) and said solvent, and is applied as an electroconductive adhesive.

* * * * *